United States Patent
Soyer

(10) Patent No.: US 7,427,850 B2
(45) Date of Patent: *Sep. 23, 2008

(54) METHOD OF MEASURING THE BATTERY LEVEL IN A MOBILE TELEPHONE

(75) Inventor: Sebastian Soyer, Aylesbury (GB)

(73) Assignee: VTech Mobile Limited, Aylesbury, Bucks (GB)

( * ) Notice: Subject to any disclaimer, the term of this patent is extended or adjusted under 35 U.S.C. 154(b) by 5 days.

This patent is subject to a terminal disclaimer.

(21) Appl. No.: 11/511,447

(22) Filed: Aug. 29, 2006
(Under 37 CFR 1.47)

(65) Prior Publication Data

US 2006/0290323 A1   Dec. 28, 2006

Related U.S. Application Data

(63) Continuation of application No. 10/203,715, filed on Mar. 31, 2003, now Pat. No. 7,102,329.

(51) Int. Cl.
*H02J 7/00* (2006.01)

(52) U.S. Cl. .................................................... 320/128
(58) Field of Classification Search ................. 320/128, 320/134, 136, DIG. 21; 324/426, 429
See application file for complete search history.

(56) References Cited

U.S. PATENT DOCUMENTS

| 5,876,870 A | * | 3/1999 | Kawabata | ..................... 429/91 |
| 5,912,544 A | * | 6/1999 | Miyakawa et al. | .......... 320/106 |

* cited by examiner

*Primary Examiner*—Gary L Laxton
*Assistant Examiner*—Ramy Ramadan
(74) *Attorney, Agent, or Firm*—Paul, Hastings, Janofsky & Walker LLP

(57) ABSTRACT

Measuring the voltage level of a mobile telephone battery during a charging operation involves disabling the charge temporarily so that the battery rapidly enters discharge mode. The discharge mode voltage is more representative of the true battery charge level, so that the present invention can be implemented to provide a battery charge level display that is accurate even when the telephone is being charged.

6 Claims, 3 Drawing Sheets

METHOD OF MEASURING THE BATTERY LEVEL IN A MOBILE TELEPHONE

This application is a continuation of, and claims priority to, U.S. application Ser. No. 10/203,715 entitled "Method of Measuring the Battery Level in a Mobile Telephone", filed on Mar. 31, 2003 now U.S. Pat. No. 7,102,329.

BACKGROUND

1. Field of the Invention

This invention relates to a method of measuring the battery level in a mobile telephone. The term 'mobile telephone' used in this patent specification should be expansively construed to cover any kind of mobile device with communications capabilities and includes radio telephones, smart phones, communicators, and wireless information devices. It includes devices able to communicate using not only mobile radio such as GSX or UMTS, but also any other kind of wireless communications system, such as Bluetooth.

2. Description of the Prior Art

It is desirable to monitor the battery level in a mobile telephone for various reasons. For example, users need to be presented with an accurate indication of battery charge level whilst the phone is in ordinary use so that the phone can be re-charged in a timely manner. Similarly, users need to know how effective charging up has been to tell if further charging is required. However, conventional battery charge level measurement techniques have significant problems. For example, the voltage of a battery can be measured during charging to give an indication of the battery charge level. However, batteries typically approach their maximum voltage within 10 minutes of charging, even though a full charge may take 60 minutes or more, so that a battery charge level indicator just measuring battery voltage will be very misleading. There is a pressing need for a more accurate method of measuring battery levels during charging.

A mobile telephone typically presents to the user a graphical indication of the state of the battery charge level: for example, there could be an image of a battery, divided into 4 segments. When no segments are permanently displayed, then the battery is low. When all segments are displayed, the battery is full. Generally, for a given segment to be displayed, the voltage delivered by the battery must exceed a given voltage threshold. Hence, for a 4 segment display, there would be 3 voltage thresholds.

Whilst a mobile telephone is in normal use (e.g. in idle mode or in actual communication), conventional battery level measurement techniques, based upon measuring voltage levels, are more accurate. However, one complicating factor is that these voltage thresholds conventionally differ depending on whether the telephone is in idle mode, or is in communication, or is charging. Ensuring that the correct threshold voltage value is used in the battery level computation adds complexity to conventional systems. Moreover, measured battery voltages are very noisy due to the complexity of a cellular system and specific filtering is needed to get reliable information.

BRIEF SUMMARY OF THE INVENTION

In accordance with a first aspect of the present invention, there is provided a method of measuring the voltage level of a mobile telephone battery during a charging operation comprising the steps of:

(a) applying a current source to charge the battery;
(b) temporarily causing the current from the current source to cease to enable the battery to enter a discharge mode;
(c) measuring the voltage level of the battery when in discharge mode; and
(d) re-applying current from the current source;
(e) repeating steps (b) and (c) until the measured voltage exceeds one or more pre-determined voltage thresholds.

Hence, by disabling the charge temporarily, the battery enters discharge mode. This may be facilitated by drawing a small current equivalent to operational drain; 100 mA is a typical figure. Typically, the charge is disabled for a short time period in comparison to the charging period, for example approximately 1 in every 10 seconds so that overall charging efficiency is not significantly affected. The discharge mode voltage is more representative of the true battery charge level, so that the present invention can be implemented to provide a battery charge level display that is accurate even during a charging operation.

Preferably, a battery level display on the telephone indicates the charge level of the battery in dependence on which pre-determined voltage threshold or thresholds has or have been exceeded. In a preferred embodiment, the battery level display can indicate 4 battery charge levels. The above method is used to determine whether the battery charge level should be displayed as falling within any of the first 3 levels; a measurement of current charge can be taken to determine if level 4 has been reached.

In a second aspect, there is provided a method of measuring the voltage level of a mobile telephone battery during normal operation comprising the steps of:

(a) measuring the voltage level of the battery, the voltage level fluctuating within an envelope of voltage values;
(b) filtering the measured voltage levels using a filter which outputs a filtered voltage output which remains at a pre-defined position in relation to the envelope of voltage values; and
(c) using the filtered voltage output as a measurement of the voltage level of the battery.

By 'normal operation', we refer to either idle mode and/or communication mode. Preferably, the filtered voltage output remains at or near the top of the actual voltage discharge waveform; the filter may be a one-way sliding filter which moves down very slowly but moves up very quickly. Preferably, a battery level display on the telephone indicates the charge level of the battery, depending upon which pre-determined voltage threshold or thresholds has or have been exceeded.

This approach can enable the same voltage thresholds to be used in both communication and idle modes, compared to prior art systems which required more complex arrangements which could discriminate between each mode and apply different voltage thresholds within each mode. Further, the filtered voltage output can be used to accurately determine when the battery is very close to being empty of charge; it is important to be able to do this since a premature detection of this state results in an unnecessary loss of operational time; conversely, if done too late, information (such as last call information and various timing data) stored in the mobile phone can be lost and the de-registration process from the network can be defective.

Another advantage of the filtered waveform approach is that the same voltage thresholds may be used in all operational modes, for example charge, discharge, idle and communication modes. Further, no specific hardware need be supplied solely to implement this approach since it can be performed in software.

In a third aspect, there is provided a mobile telephone adapted to perform the methods of the first and second inventive aspects defined above.

In a fourth aspect, there is provided software programmed to perform the methods of the first and second inventive aspects defined above.

DETAILED DESCRIPTION OF THE INVENTION

Charging Mode

Figure 1:
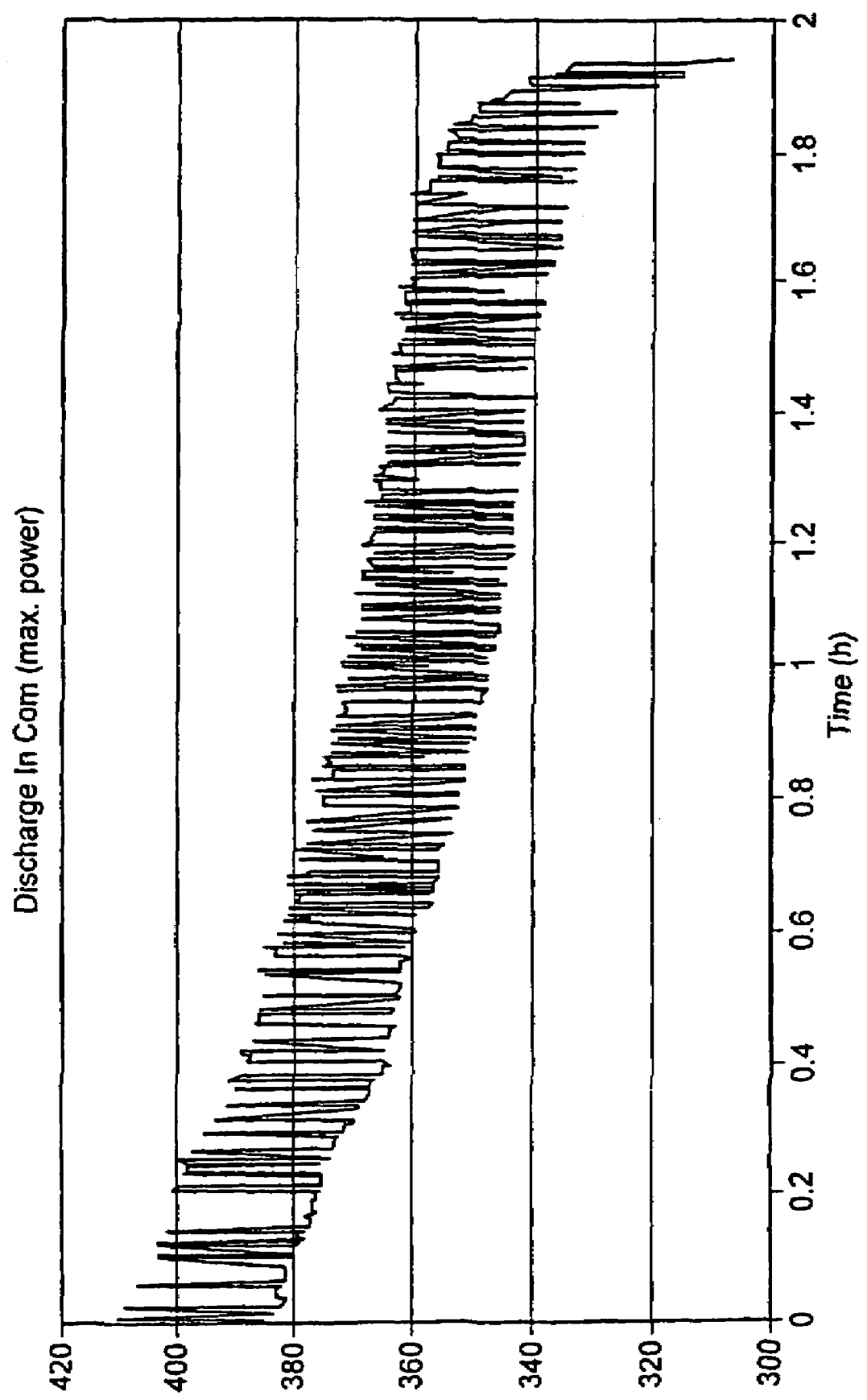
FIG. 1 is a graph showing normal voltage discharge against time for a phone in communication mode.

It is not practical to use the same voltage thresholds to estimate the battery charge and discharge levels, since the voltage curve during charge is completely different from the discharge curve. In essence, the is chemistry of the battery is such that its voltage during charge reaches very quickly its maximum level after a few minutes of charge. For this reason, you cannot use the battery voltage during charge as a reliable indication of the charge level. Also, you cannot define a separate set of thresholds for the charge level indication, as it would lead to inconsistencies between the levels applicable during charge and discharge states.

The solution to this problem has been found by periodically disabling the charger during charge, to return the battery to its discharge state, then measuring the voltage level and comparing it to the existing voltage thresholds. Since the end of charge is determined by a current measurement, this method is only used to determine the crossover for voltage levels 1, 2 and 3 in an embodiment with 4 battery charge levels.

The algorithm works as follows (from empty battery):

```
Begin
  Do ADC (Analog to Digital Conversion) measurement and calibrate;
  If measurement < 95% of Typical_Battery_Voltage then
        we are at level 0 (battery empty),
        do not disable charge;
        Wait 10 seconds
Repeat until ADC measurement > 95% of Typical_Battery_Voltage
Begin
  Disable charger;
  Do ADC (Analog to Digital Conversion) measurement;
  Re-enable charger;
  Pass the result to the battery display management for level comparison
    with thresholds;
    Wait 5 seconds;
Repeat until MMI = level 3
Begin
    Wait 10 seconds
    Measure Charge Current
Repeat until Current < end of charge current threshold
Set battery display to level 4
```

As this method only disables the charge for approximately 1 out of every 10 seconds, for approximately ⅔ of the charging period, we can assume the charge to be nearly 95% efficient, yet accurate.

Communication Mode

A GSM communication consists of a low current consumption for most of the time, followed by high current bursts during radio activity. ADC (Analog to Digital Conversion) measurements are taken during a burst and others are taken outside a burst. Moreover, the battery voltage during communication is very noisy due to this bursted mode. The FIG. 1 waveform is measured during communication.

Using a non-linear ("one way") filter, the level at the top (outside a burst) can be estimated. The filter works as follows:

The filtered value T(n−1) at time (n−1) is what is used as the reference value.

The initial value T(0) is set before communication has begun (measured during initialization & then follows battery level in idle mode)

A new measurement Tmeas (n) is made at time (n):
  If the new measurement Tmeas (n) is greater than the previous value T(n−1), the filtered value at time (n) becomes the measured value T(n)=Tmeas (n)
  If the new measurement Tmeas (n) is less than the previous value T(n−1), then the filtered value at time (n) is reduced by a small amount.: T(n)=T(n−1)−(1−1)*[T(n−1)−Tmeas(n)] where 1 is a parameter used for tuning noise rejection (this subtracts a proportion of the difference between the two values from the previous value).

In algorithmic form, this gives a non-linear ('one way') filter algorithm as follows:

```
T(O) is initially set to the measured battery level during idle mode
Begin measurement loop;
    Do a voltage ADC (Analog to Digital Conversion);
    Ti = New ADC Reading
    If T1 > T then
        T = T1
    else
        T = T − (1−1)*(T−T1)
    Send value of T to the battery display management for level
    comparison
    Wait 5 seconds
Repeat
```

Figure 2:
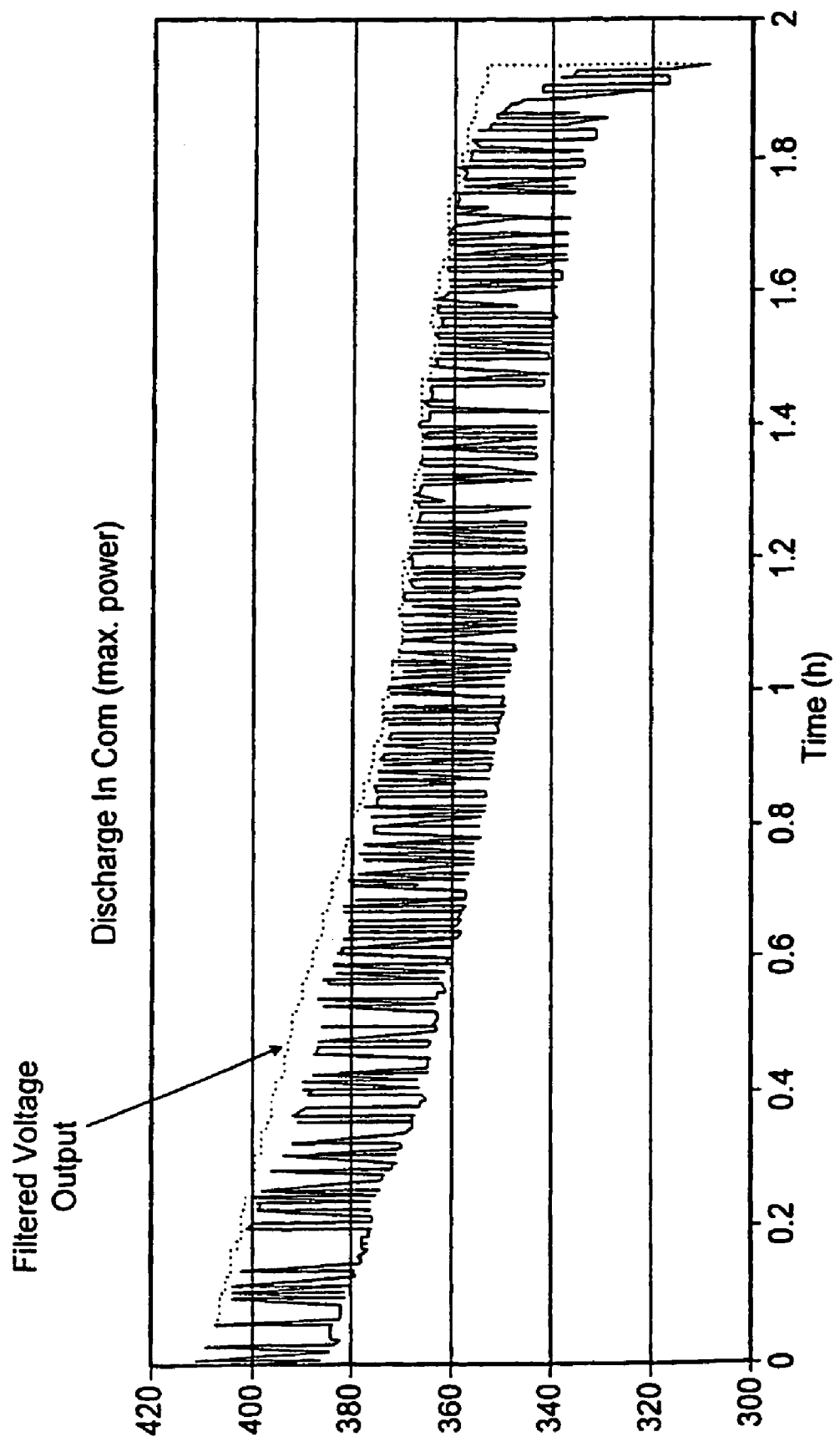
FIG. 2 is a graph showing the filtered output voltage in relation to the normal voltage discharge against time for a phone in communication mode.

By applying this filter to the plot shown above, this gives a waveform <T(n)>that 'rides' on top of the envelope of the measured ADCs, as shown in FIG. 2.

This level is compared against the existing discharge levels to determine the battery capacity while in communication.

Figure 3:
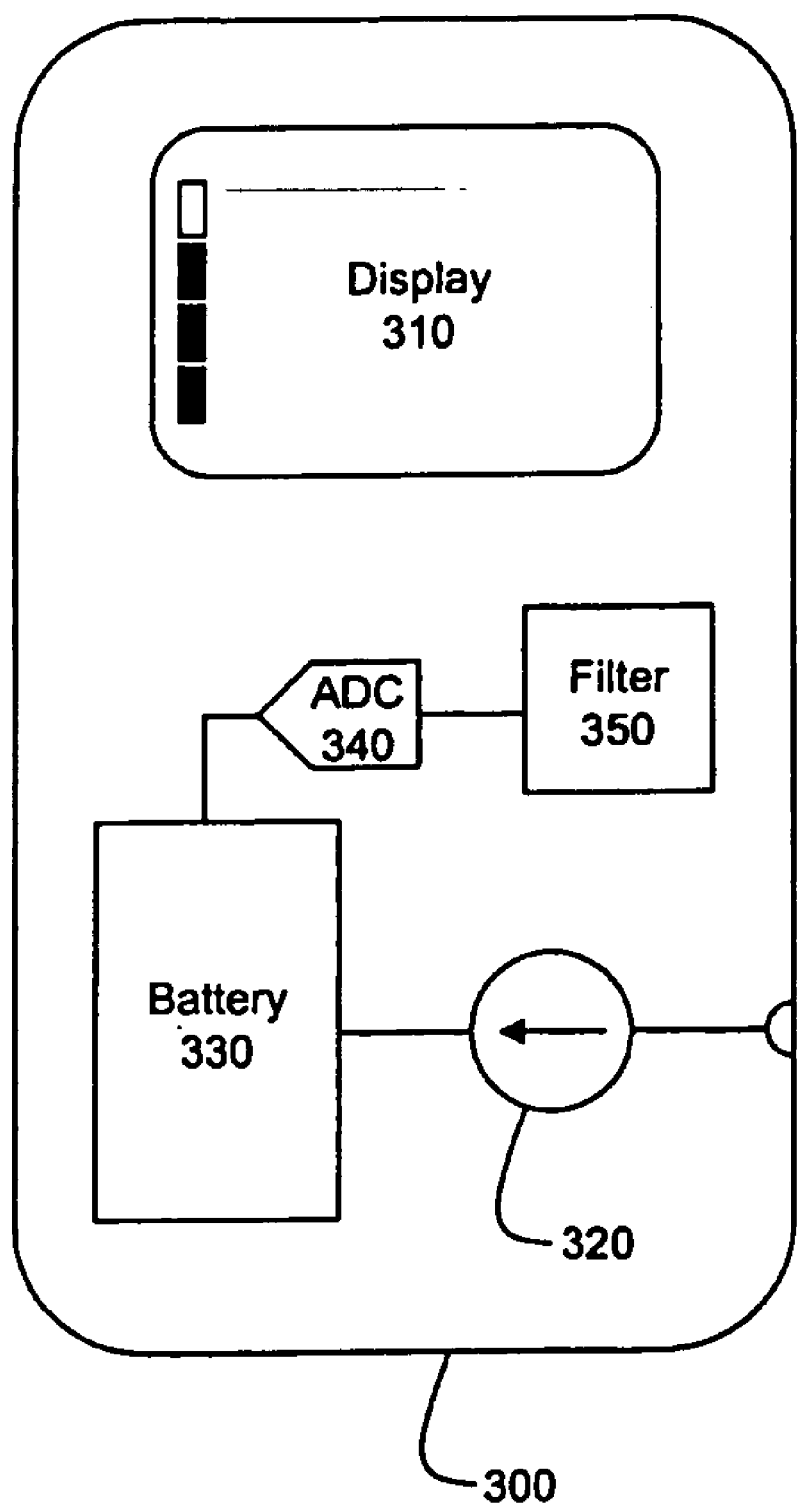
FIG. 3 is a block diagram of a portion of a mobile telephone according to one aspect of the present invention.

FIG. 3 is a block diagram of a portion of mobile phone 300, arranged to measure the level of battery 330 as described hereinabove. Mobile phone 300 includes current source 320, which provides a charging current to battery 330. Analog-to-digital converter (ADC) 340 measures the voltage level of battery 330. Filter 350 performs a filtering algorithm on the measurements of ADC 340, as described above, to determine a value indicative of the charge level of battery 330. Display 310 provides a four-segment display indicative of the charge level of battery 330.

What is claimed is:

1. A method for measuring a voltage level of a rechargeable battery during one or more modes of operation, the method comprising:
   measuring the voltage level of the battery, the voltage level fluctuating within an envelope of voltage values;
   filtering the measured voltage levels using a filter which outputs a filtered voltage output which remains at a pre-defined position in relation to the envelope of voltage values, wherein the filter is a one-way sliding filter which moves down very slowly but moves up very quickly; and using the filtered voltage output as a measurement of the voltage level of the battery.

2. The method of claim 1, wherein the filtered voltage output remains at or near the top of the envelope of voltage values.

3. A method for measuring a voltage level of a rechargeable battery, comprising:

measuring the voltage level of the battery, the voltage level fluctuating within an envelope of voltage values;

filtering the measured voltage levels using a filter which outputs a filtered voltage output which remains at a pre-defined position in relation to the envelope of voltage values, wherein the filter is a one-way sliding filter which moves down very slowly but moves up very quickly; and using the filtered voltage output as a measurement of the voltage level of the battery.

4. A method of indicating the voltage level of a rechargeable battery in an electronic device, comprising:

measuring the voltage level of the battery, the voltage level fluctuating within an envelope of voltage values;

filtering the measured voltage levels using a filter which outputs a filtered voltage output which remains at a pre-defined position in relation to the envelope of voltage values, wherein the filter is a one-way sliding filter which moves down very slowly but moves up very quickly; and displaying the filtered voltage output on a display of the electronic device as a measurement of the voltage level of the battery.

5. The method of claim 4, wherein the filtered voltage output remains at or near the top of the envelope of the envelope of voltage values.

6. The method of claim 4, wherein a battery level display on the electronic device indicates a charge level of the battery in dependence on which a predetermined voltage threshold or thresholds has or have been exceeded.

* * * * *